United States Patent
Nakagawa et al.

(10) Patent No.: US 6,288,347 B1
(45) Date of Patent: Sep. 11, 2001

(54) WIRING BOARD FOR FLIP-CHIP-MOUNTING

(75) Inventors: Shoichi Nakagawa; Takashi Yamasaki; Shinya Terao, all of Kokubu (JP)

(73) Assignees: Kyocera Corporation, Kyoto; Denso Corporation, Kariya, both of (JP)

( * ) Notice: Subject to any disclaimer, the term of this patent is extended or adjusted under 35 U.S.C. 154(b) by 0 days.

(21) Appl. No.: 09/201,626

(22) Filed: Nov. 30, 1998

(30) Foreign Application Priority Data

May 30, 1997 (JP) .................................... 9-141753

(51) Int. Cl.[7] .............................. H01R 12/04; H05K 1/11
(52) U.S. Cl. ........................... 174/261; 174/260; 29/840; 29/852
(58) Field of Search ................................... 174/260, 261, 174/255; 361/701, 783, 767, 768, 769, 770, 771; 29/840, 852

(56) References Cited

U.S. PATENT DOCUMENTS

| | | | |
|---|---|---|---|
| 4,677,254 | * 6/1987 | Boss et al. | 174/68.5 |
| 5,073,840 | * 12/1991 | Coors | 361/400 |
| 5,397,864 | * 3/1995 | Rai et al. | 174/261 |
| 5,443,786 | * 8/1995 | Yokoyama et al. | 419/9 |
| 5,886,877 | * 3/1999 | Shingai et al. | 361/768 |

* cited by examiner

Primary Examiner—Hyung-Sub Sough
Assistant Examiner—Jeremy Norris
(74) Attorney, Agent, or Firm—Hogan & Hartson, LLP.

(57) ABSTRACT

A wiring board for flip-chip-mounting in which a conductor layer is provided in a portion under the semiconductor element-mounting surface of the ceramic insulating board, the electrically conducting layer being electrically independent from the wiring pattern that is flip-chip-connected. The insulating board is effectively suppressed from deforming such as from warping or undulating. In particular, the semiconductor element-mounting surface exhibits a high degree of flatness. Therefore, the wiring board exhibits a high junction reliability at the flip-chip-connected portions, and is very useful as a semiconductor package or as a hybrid integrated circuit that is used in various electronic devices being mounted on the vehicles.

15 Claims, 1 Drawing Sheet

WIRING BOARD FOR FLIP-CHIP-MOUNTING

BACKGROUND OF THE INVENTION

1. Field of the Invention

The present invention relates to a wiring board for flip-chip-mounting. More specifically, the invention relates to a wiring board that has a very flat surface and that is used for flip-chip-mounting a semiconductor element (hereinafter often called peripheral-type semiconductor element), which is very flat and has flip- chip-connect electrodes arranged in a circular manner along the peripheral edge on the lower surface thereof.

2. Description of the Prior Art

So far, a ceramic wiring board obtained by forming many wiring conductors of a high-melting metal such as tungsten, molybdenum or manganese on the surface, on the inside or on the bottom surface of an insulating board composed of a ceramic such as a sintered product of alumina, has been most widely used for a package containing a semiconductor element or hybrid integrated circuit devices on which are mounted a semiconductor element as well as various electronic parts such as capacitors and resistors. In the above-mentioned package, for instance, a surface region (e.g., recessed portion) for mounting a semiconductor element is formed in nearly the central portion in the upper surface of the ceramic insulating board, and a semiconductor element is secured onto the surface region by using an adhesive such as a glass, a resin or a brazing material. The electrodes formed on the semiconductor element are electrically connected to the wiring conductors formed surrounding the surface region by bonding the wires. Moreover, a closure made of a metal or a ceramic is secured, by using the same adhesive as the one mentioned above, onto the surface region of the insulating board in order to air-tightly seal the semiconductor element.

Accompanying the trend toward designing the semiconductor elements such as ICs and LSIs in a highly integrated form and in very small sizes yet so as to operate at high speeds, in recent years, however, the wiring conductors formed on the wiring board for mounting the semiconductor element are becoming ever fine and are forming highly dense wiring patterns, and it is becoming necessary to mount the semiconductor element more compactly. Because of this reason, a flip-chip-mounting method has been employed more frequently to directly connect the electrodes of the semiconductor element to the wiring conductors of the insulating board (wiring board) by using solder bumps instead of bonding the wires. That is, according to the flip-chip-mounting method, the electrodes of the semiconductor element are directly connected to the wiring conductors and, hence, the region on where the semiconductor element is to be mounted on the surface of the insulating board must be flat to a high degree.

The electronic devices having a wiring board on which the semiconductor element is mounted are finding expanding applications, and are being used in a variety of environments under strict conditions. For example, many of the vehicles such as automobiles have been furnished with electronic control equipment, and the electronic devices mounted on the vehicles are used under very strict environmental conditions and must, hence, be highly reliable. Factors which are most important for maintaining a high reliability under severe environmental conditions are mechanical properties such as shearing strength or thermal fatigue life in a portion where the circuit is joined by soldering. According to the above-mentioned flip-chip-mounting method, the portions where the semiconductor element is joined to the wiring conductors on the surface of the insulating board relying on the solder bumps, exhibit excellent shearing strength and thermal fatigue life playing an important role for maintaining reliability of the electronic devices that are used being mounted on the vehicles. From this point of view, too, the wiring board on which the semiconductor element is flip-chip-mounted must have a very flat surface in a region on where the semiconductor element is mounted.

According to the conventional wiring board, however, the electrically insulating ceramics constituting the insulating board has a coefficient of thermal expansion greatly different from that of the wiring conductors, making it difficult to maintain a high degree of flatness.

That is, the above wiring board is prepared by applying an electrically conducting paste, according to a predetermined wiring pattern, onto a ceramic green sheet having through-holes formed at predetermined positions, filling the through-holes with the electrically conducting paste and, as required, laminating these green sheets one upon the other, followed by simultaneously firing the green sheets and the electrically conducting paste. Due to a difference in the contraction between the green sheet and the electrically conducting paste during the step of firing, however, the wiring board (insulating board) is warped or undulated, making it difficult to obtain a highly flat wiring board maintaining a good yield.

In order to solve this problem, Japanese Examined Patent Publication (Kokoku) No. 25277/1990 and Japanese Unexamined Patent Publication (Kokai) No. 31368/1992 disclose methods of preparing a wiring board by simultaneously firing a ceramic green sheet and an electrically conducting paste, and firing them again while applying a uniform load by using a suitable jig.

According to such a method, however, the firing must be repeated a plural number of times and the load must be uniformly exerted by using a jig or the like, requiring cumbersome operations, resulting in an increase in the cost of production and greatly deteriorating the production efficiency. Besides, the surface state of the jig used for exerting the load is transferred onto the surface of the insulating board, causing the flatness of the insulating board to be deteriorated. Besides, the wiring pattern formed by the electrically conducting paste is broken or is short-circuited due to the contact to the jig.

SUMMARY OF THE INVENTION

The object of the present invention therefore is to provide a wiring board for flip-chip-mounting, which effectively prevents the insulating board from being warped or undulated, features a very high degree of flatness, and can be easily produced.

That is, the present invention provides a wiring board for flip-chip-mounting a semiconductor element having a number of flip-chip-connect electrodes arranged in a circular manner along a peripheral edge on a lower surface thereof, wherein:

said wiring board comprises a ceramic insulating board having a surface region for mounting said element, and a wiring pattern that will be connected to said flip-chip-connect electrodes;

said wiring pattern includes conductor lines of a number corresponding to the flip-chip connect electrodes of the semiconductor element that is flip-chip-mounted, each line constituting the wiring pattern includes a horizontal conductor passage that extends in a horizontal direction inside the insulating board and a via-hole conductor passage that extends upward from an end of said horizontal conductor passage to said surface region, the ends of the via-hole conductor passages and of the horizontal conductor passages are positioned in a circular manner so as to be corresponded to the flip-chip connect electrodes of said semiconductor element, and when said insulating board is viewed from the upper side, no horizontal conductor passage is formed in space defined by the ends of the via-hole conductor passages and the horizontal conductor passages; and a conductor layer is formed in said insulating board on a portion located within said surface region or on a lower side of said surface region, and when said insulating board is viewed from the upper side, said conductor layer is positioned in space defined by the ends of said via-hole conductor passages and the horizontal conductor passages, and a gap relative to the horizontal conductor passages or to the via-hole conductor passages is not smaller than 50 µm.

The wiring board for flip-chip-mounting of the present invention has a remarkable feature in the provision of a conductor layer on the surface of the insulating board or inside thereof, the conductor layer being electrically independent from the wiring pattern formed on the insulating board. That is, the conductor layer is formed on the surface region of the insulating board on which the semiconductor element is flip-chip- mounted or on the lower side thereof. When the insulating board is viewed from the upper side, the conductor layer is formed on a portion where no wiring pattern is formed, and the gap between the conductor layer and the wiring pattern is at least 50 µm. Provision of the conductor layer makes it possible to effectively prevent the deformation such as warping or undulation that stems from a difference in the thermal expansion between the electrically conducting material forming the wiring pattern and the insulating ceramics such as a sintered product of alumina forming the insulating board. Therefore, the wiring board of the present invention has a very high degree of flatness, and the flip-chip-mounting makes it possible to maintain a high degree of reliability of the connection in the portions where the semiconductor element is joined to the wiring board by soldering. Besides, what is important is that the conductor layer is easily formed by applying a paste containing a predetermined electrically conducting material like other wiring patterns, onto the surface of the ceramic green sheet of before being fired, and by firing the paste simultaneously with the green sheet. Therefore, the electrically conducting layer is formed without requiring any additional firing step. Thus, the cost of production a does not increase and no laborious work is required, offering a great advantage even from the standpoint of production.

DETAILED DESCRIPTION OF THE INVENTION

Figure 1:
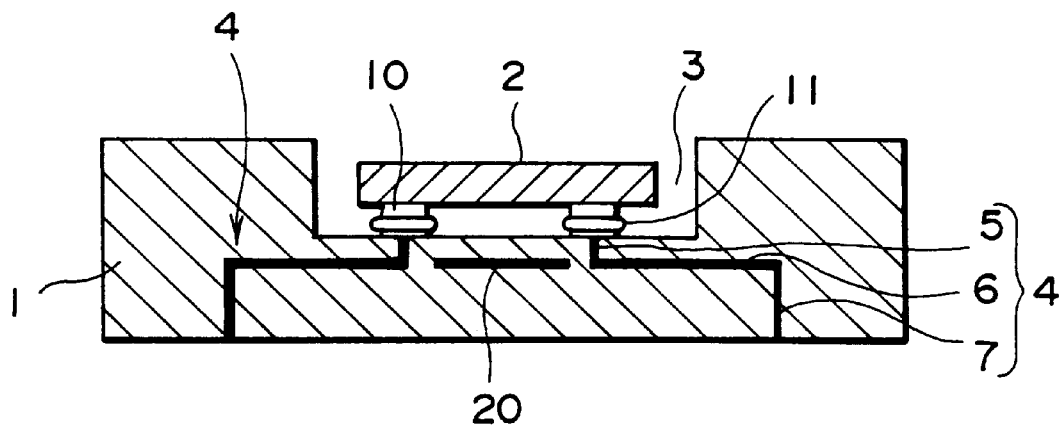
FIG. 1 is a diagram illustrating, in cross section, the structure of a wiring board for flip-chip-mounting according to the present invention together with a peripheral-type semiconductor element mounted thereon.
Figure 2:
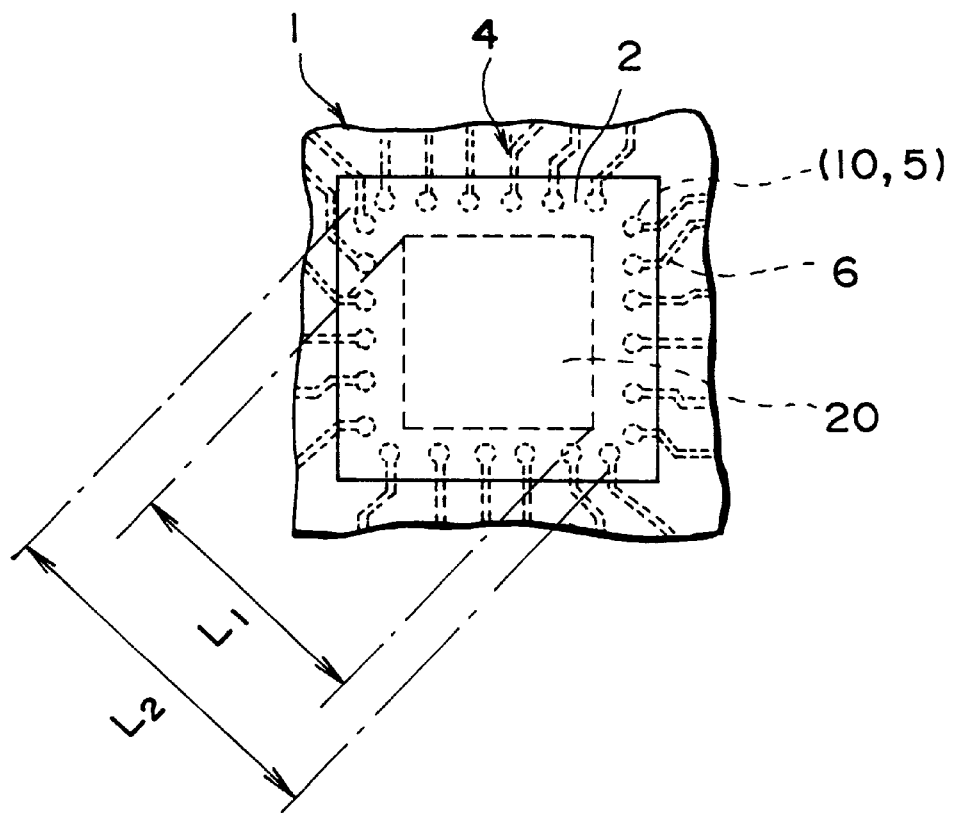
FIG. 2 is a plan view of when the major portion of the wiring board shown in FIG. 1 is viewed from the upper side.

In FIGS. 1 and 2, the wiring board of the present invention is equipped with an insulating board 1 formed of an insulating ceramic such as a sintered product of alumina. In the surface of the insulating board 1 is formed a recessed portion 3 for mounting a peripheral-type semiconductor element 2. Furthermore, a wiring pattern consisting of a number of conductor lines 4 is formed in the insulating board 1. Each conductor line includes a first via-hole conductor passage 5 extending to the bottom of the recessed portion 3 in the surface of the board 1, a horizontal conductor passage 6 extending in the board 1 in a horizontal direction, and a second via-hole conductor passage 7 extending to the bottom surface of the board 1. As will be obvious from FIG. 1, an end of the horizontal conductor passage 6 is connected to the first via-hole conductor passage 5, and the other end thereof is connected to the second via-hole conductor passage 7. As required, a connection electrode such as a conductor pad is provided at the lower end of the second via-hole conductor 7, and the connector line is connected to an external circuit board via the connection electrode.

The peripheral-type semiconductor element 2 mounted on the wiring board has a number of connection electrodes 10 arranged in a circular manner along the peripheral edge on the lower surface thereof, and each connection electrode 10 is provided with a solder bump 11. Examples of such a semiconductor element include an IC chip, a power IC chip for power IC and the like chips that are generally used. As will be obvious from FIG. 1, the connection electrodes 10 of the semiconductor element 2 are connected to the upper ends of the first via-hole conductor passages 5 via solder bumps 10, so that the semiconductor element 2 is flip-chip-mounted on the wiring board. From the standpoint of enhancing the reliability at the connection portion formed by the solder bump 10, therefore, the flatness of the surface of the bottom of the recessed portion 3 in the insulating board 1 serves as a very important factor. As required, furthermore, a connection electrode consisting of a conductor pad or the like may be provided at the upper end of the first via- hole conductor passage 5 connected to the solder bump 10. After the semiconductor element 2 is mounted, a closure (not shown) made of a metal or a ceramic is secured so as to close the recessed portion 3, and the semiconductor element 2 is air-tightly sealed inside the recessed portion 3. It is, of course, allowable to mount the semiconductor element 2 on a flat surface of the insulating board 1 without forming the recessed portion 3, and to air-tightly seal the semiconductor element 2 that is mounted with the closure.

As will be understood from FIG. 2, in particular, the wiring pattern formed in the insulating board 1 is constituted by conductor lines 4 of a number corresponding to the connection electrodes 10 of the semiconductor element 2, and the first via-hole conductor passages 5 of the conductor lines 4 are connected to the connection electrodes 10 of the semiconductor element 2 through solder bumps 11. Therefore, the ends on one side of the first via-hole conductor passages 5 and of the horizontal conductor passages 6 are arranged at positions corresponding to the connection electrodes 10. As shown in FIG. 2, therefore, no wiring pattern exists in space in the insulating board 1 defined by the first via-hole conductor passages 5 and the like.

In the present invention, a conductor layer 20 is formed in space where the wiring pattern does not exist, the conductor layer 20 being electrically independent from the wiring pattern. Provision of the conductor layer 20 makes it possible to prevent the deformation such as warping or undulation that stems from a difference in the coefficient of thermal expansion between the electrically conducting material constituting the wiring pattern and the sintered product constituting the insulating board 1. That is, when a predetermined wiring pattern is formed on the surface of the ceramic green sheet by using a paste containing an electrically conducting material and when the conducting paste and the green sheet are fired simultaneously, the resulting sintered product (insulating board) is warped or undulated due to a difference in the coefficient of thermal expansion between the two. Upon forming the conductor layer 20 at the above-mentioned position, however, such a deformation is effectively suppressed. Though the reason has not yet been clarified, it is presumed that the ceramics present under the conductor layer 20 is prevented from contracting upon firing due to the conductor layer 20 and, as a result, deformation of the surface of the board 1 is suppressed.

In the present invention, when viewed from the upper side as shown in FIG. 2, the conductor layer 20 maintains a gap (corresponds to a gap relative to the first via-hole conductor passage 5) of not smaller than 50 $\mu$m relative to the conductor lines 4 constituting the wiring pattern, i.e., maintains a gap of not smaller than 50 $\mu$m even at a position where the conductor layer 20 and the wiring pattern are closest to each other. When the gap is smaller than 50 $\mu$m, the conductor layer 20 and the wiring pattern tends to become short-circuited. That is, though the circuit may favorably function immediately after the preparation of the wiring board, short-circuit may occur between the conductor layer 20 and the wiring pattern due to thermal hysteresis after the device is repetitively used for extended periods of time.

When the gap is too great between the conductor layer 20 and the wiring pattern, on the other hand, the action for suppressing the deformation is lost. It is therefore desired that the conductor layer 20 has a plane shape which is as large as possible but maintaining the gap of not smaller than 50 $\mu$m. In general, the connection electrodes 10 of the semiconductor element 2 are arranged in a rectangular shape as shown in FIG. 2 and, hence, it is desired that the conductor layer 20 has a rectangular planar shape from the standpoint of easily adjusting the position. When the diagonal line of a rectangle formed by the conductor layer 20 has a length L1 and the diagonal line of a rectangle formed by the connection electrodes 10 has a length L2, furthermore, it is desired that a ratio L1/L2 is not smaller than 0.4.

So far as the above-mentioned conditions are satisfied, furthermore, the conductor layer 20 can be provided at any position. Generally, however, it is desired that the conductor layer 20 is provided at a depth of not larger than 750 $\mu$m from the bottom surface of the recessed portion 3. When the conductor layer 20 is provided at a position which is too deep, the action for suppressing the deformation may not often be exhibited to a sufficient degree. From the standpoint of enhancing the wiring density according to the present invention, it is most desired to provide the conductor layer 20 on a plane in flush with the horizontal conductor passages 6 of the conductor lines 4 constituting the wiring pattern The conductor layer 20 may be grounded so far as it is electrically independent from the wiring pattern.

The above-mentioned wiring board of the present invention can be prepared by a known method with the exception of forming the conductor layer 20.

For instance, a sintered powder of alumina or the like is used as a material for forming the insulating board 1, and to which are, as required, added a powder of sintering assistant such as MgO or CaO as well as a filler such as $SiO_2$ or the like. To the obtained mixed powder are further added an organic binder, a plasticizer and a solvent to prepare a slurry. By using this slurry, a sheet-like molded article (green sheet) is prepared relying upon a sheet-molding method such as doctor blade method, calender roll method or extrusion-molding method. Through-holes are formed in the green sheet at predetermined positions and, at the same time, the conducting paste is applied onto the positions corresponding to the horizontal conductor passages 6 and the metal layer 20 by a screen-printing method or a gravure-printing method, and the through-holes are filled with the conducting paste. On the thus prepared green sheet is overlapped another green sheet of a shape corresponding to the upper surface of the insulating board 1 in a manner that the through-holes are in agreement. The green sheets are then simultaneously fired to prepare a desired wiring board.

The firing is conducted in a nonoxidizing atmosphere such as in an inert gas like nitrogen, argon, etc. or in a mixture gas of these inert gases and hydrogen. The firing temperature may differ depending upon the kind of the sintered powder that is used. When alumina is used, however, the sintering temperature is set to be from about 1500 to about 1700° C.

As the conducting paste for forming the conductor layer 20 or the horizontal conductor passages 6 or as the conducting paste for forming the via-hole conductor passages filled in the through-holes, furthermore, there can be used the one comprising, as a chief component, a high-melting metal powder such as tungsten, molybdenum or manganese, to which are further mixed an organic binder, a plasticizer and a solvent.

According to the present invention, it is desired to use a conducting paste for forming the conductor layer 20 and a conducting paste for forming the horizontal conductor passages 5 having a firing contraction ratio S1/S2 as represented by the following formula, Firing contraction ratio=S1/S2 wherein S1 is a coefficient of volume contraction of a fired sheet obtained by firing a sheet formed of an electrically conducting material-containing paste for forming a conductor layer having a thickness of 100 $\mu$m at a temperature same as the firing temperature for forming the insulating board, and S2 is a coefficient of volume contraction of a fired sheet obtained by firing a sheet formed of an electrically conducting material-containing paste for forming horizontal conductor passages having a thickness of 100 $\mu$m at a temperature same as the firing temperature for forming the insulating board, of from 0.6 to 1.4 and, particularly, from 0.8 to 1.0. That is, forming the conductor layer 20 and the horizontal conductor passages 5 by using conducting pastes of different compositions so that the firing contraction ratio lies within the above-mentioned range, is desirable from the standpoint of lengthening the thermal fatigue life of the wiring board and increasing the strength of the solder-joined portions. Such a wiring board can be very effectively used for various electronic devices that are particularly used being mounted on the vehicles.

To adjust the firing contraction ratio to lie within the above-mentioned range, a nitride of Ti, V, Nb or Ta or an oxide such as $Al_2O_3$ may be added to the conducting paste in an amount that will not cause the electric resistance to so increase as to develop poor conduction of the circuit. That is, the coefficient of contraction upon firing decreases with an increase in the amount of the nitride or the oxide that is blended. By utilizing this, therefore, the firing contraction ratio is adjusted to lie within the above-mentioned range.

The wiring board thus obtained is effectively suppressed from being deformed such as from being warped or undulated and, particularly, has a very good flat surface on where the semiconductor element will be mounted. Therefore, the wiring board permits the semiconductor element to be flip-chip-mounted very favorably maintaining high reliability at the flip-chip- connected portions. The wiring board is very useful for the semiconductor packages and the hybrid integrated circuits used in various electronic devices being mounted on vehicles.

The invention will now be described by way of a working example.

EXAMPLE

A slurry was prepared by adding a known organic binder, a plasticizer and a solvent to a starting powder comprising $Al_2O_3$ as a main component and to which has been added a sintering assistant such as $SiO_2$, MgO or CaO. A ceramic green sheet having a thickness of about 300 μm was obtained from this slurry based on a known tape-molding technology. Then, through-holes were formed in the ceramic green sheet by punching.

On the other hand, alumina particles were added in a suitable amount to a powder comprising a high-melting metal such as W or Mo as a main component, and to which was further added a known organic binder, a plasticizer and a solvent, followed by kneading in a kneading machine to prepare a basic conducting paste.

Furthermore, the amount of alumina was adjusted in the above basic conducting paste, to prepare a conducting paste for forming a wiring pattern and a conducting layer having a different coefficient of contraction by firing.

The coefficients of contraction of the above conducting pastes by firing were found by firing the conducting pates in the form of a sheet having a thickness of 100 μm under the same conditions as the conditions for firing the wiring board that will be described below, and measuring changes in the sizes before and after the firing by using a microscope equipped with a micrometer.

Next, the conducting paste for forming the wiring pattern was applied onto the ceramic green sheet relying upon the screen-printing method according to a pattern corresponding to the horizontal conducting passages, so as to form a rectangular space in the central portion as shown in FIG. 2 and, then, the through-holes were filled with the conducting paste for forming the wiring pattern relying upon the pressurized charging method.

In the rectangular space formed at the center by the pattern corresponding to the horizontal conductor passages 6, there were formed, at their respective positions, a ceramic green sheet having a conductor layer pattern of a rectangular shape formed by using the paste for forming the conductor layer, and a ceramic green sheet having only through-holes filled with the paste for forming the wiring pattern at predetermined positions but having neither the horizontal conductor passage pattern nor the conductor layer pattern.

A laminate was prepared by combining the above-mentioned green sheets in five layers, and was fired in a reducing atmosphere of a mixture gas of hydrogen and nitrogen at a temperature of 1600° C. to prepare a wiring board having a thickness of about 1.25 mm. Table 1 shows the positions of the conductor layers and of the horizontal conducting passages, gaps X between the conductor layers and the horizontal conductor passages, ratios of the lengths L2 of the diagonal lines of the rectangles formed at the center by the horizontal conductor passages to the lengths L1 of the diagonal lines of the conductor layers, and firing contraction ratios S1/S2.

The positions of the conductor layers and of the horizontal conductor passages were indicated by the numbers of the layers in which they were formed as counted from the upper side. The gaps X are those at portions where the two are closest to each other as viewed from the upper side as shown in FIG. 2. No conductor layer was formed in the wiring board of the sample No. 22.

TABLE 1

| Sample No. | Gap x μm | L1/L2 | Layer in which the conductor layer is formed | Layer in which the horizontal conductor passages are formed | Firing contraction ratio S1/S2 |
|---|---|---|---|---|---|
| *1 | 40 | 0.99 | 2 | 2 | 1.0 |
| 2 | 75 | 0.98 | 2 | 2 | 0.4 |
| 3 | 75 | 0.98 | 2 | 2 | 0.6 |
| 4 | 75 | 0.98 | 2 | 2 | 0.8 |
| 5 | 75 | 0.98 | 2 | 2 | 0.9 |
| 6 | 50 | 0.98 | 2 | 2 | 1.0 |
| 7 | 75 | 0.97 | 2 | 2 | 1.2 |
| 8 | 75 | 0.97 | 2 | 2 | 1.4 |
| 9 | 75 | 0.97 | 2 | 2 | 1.6 |
| 10 | 100 | 0.97 | 3 | 3 | 0.6 |
| 11 | 100 | 0.97 | 3 | 3 | 1.0 |
| 12 | 100 | 0.97 | 3 | 3 | 1.2 |
| 13 | 100 | 0.97 | 4 | 4 | 0.6 |
| 14 | 100 | 0.97 | 4 | 4 | 0.9 |
| 15 | 100 | 0.97 | 4 | 4 | 1.2 |
| 16 | 100 | 0.97 | 5 | 5 | 0.6 |
| 17 | 100 | 0.97 | 5 | 5 | 0.9 |
| 18 | 100 | 0.97 | 5 | 5 | 1.2 |
| 19 | 100 | 0.97 | 3 | 2 | 0.9 |
| 20 | 100 | 0.97 | 4 | 2 | 0.9 |
| 21 | 100 | 0.97 | 5 | 2 | 0.9 |
| *22 | — | — | — | 2 | — |

Samples marked with * fall outside the scope of the invention.

The wiring boards were evaluated for their flatness on the surfaces of the boards, shearing strength at the flip-chip-junction portions and thermal fatigue life at the flip-chip-junction portions. Based upon the results of evaluation, the devices were totally evaluated concerning the long-term reliability of the junction portions of when the devices were used being mounted on the vehicles.

(Evaluating the Degree of Flatness)

A contact-type surface roughness meter equipped with a probe having a radius of curvature of 5 μm at the end was used to measure a maximum displacement by scanning the surface of the wiring board with the probe along the diagonal lines. There was also prepared a reference wiring board forming neither the conductor layer nor the wiring pattern but forming only flip-chip-connect electrodes and wiring pads for checking the conduction, in the same manner as described above. This reference wiring board, too, was measured for its maximum displacement on the surface in the same manner as described above.

A maximum displacement of the reference wiring board was regarded to be a reference warping, ratios of the maximum displacements of the sample wiring boards to the reference warping were calculated, and the degree of flatness was evaluated relying upon this ratio. The smaller the ratio, the better the degree of flatness.

(Evaluating the shearing strength of the flip-chip-joined portions)

A silicon chip of the peripheral type was joined to each of the sample wiring boards relying on the flip-chip method via the solder bumps.

The wiring board was secured, a force was exerted onto the side surface of the silicon chip mounted on the wiring board by using a push-pull gauge in a direction in parallel with the wiring board to measure the strength of when the silicon chip peeled off the wiring board. The reference wiring board was also measured for its peeling strength in the same manner as described above and was regarded to be a reference shearing strength.

Ratios of the peeling strengths measured from the sample wiring boards to the reference shearing strength were found, and the shearing strengths were evaluated based upon the ratios.

(Thermal fatigue life of the flip-chip-joined portions)

The wiring boards on which the silicon chips were flip-chip-mounted were subjected to the temperature cycle testing in which the cooling down to −65° C. and the heating up to 150° C. were alternatingly repeated. The electric conduction at the flip-chip-junction portions were examined every 1000 cycles, 2000 cycles and 3000 cycles, to judge the development of cracks at the junction portions and to evaluate the thermal fatigue life.

TABLE 2

| Sample No. | Ratio of warpings of samples to ref. warping | Ratio of shearing strengths of samples to reference shearing strength | Conduction after temp. cycle testing (cycles) | | | Overall judgement | Remarks |
|---|---|---|---|---|---|---|---|
| | | | 1000 | 2000 | 3000 | | |
| *1 | 0.9 | 1.1 | yes | yes | yes | poor | short-circuit |
| 2 | 1.4 | 0.7 | yes | yes | no | acceptable | |
| 3 | 0.7 | 1.0 | yes | yes | yes | good | |
| 4 | 0.4 | 1.1 | yes | yes | yes | excellent | |
| 5 | 0.8 | 1.2 | yes | yes | yes | excellent | |
| 6 | 0.8 | 1.1 | yes | yes | yes | excellent | |
| 7 | −0.2 | 1.2 | yes | yes | yes | good | |
| 8 | −0.4 | 1.0 | yes | yes | yes | good | |
| 9 | −0.8 | 0.7 | yes | yes | no | acceptable | |
| 10 | 0.7 | 1.0 | yes | yes | yes | good | |
| 11 | 0.5 | 1.0 | yes | yes | yes | excellent | |
| 12 | 0.5 | 1.0 | yes | yes | yes | good | |
| 13 | −0.6 | 0.9 | yes | yes | yes | good | |
| 14 | 0.5 | 1.0 | yes | yes | yes | excellent | |
| 15 | 0.9 | 1.0 | yes | yes | yes | good | |
| 16 | −0.8 | 0.9 | yes | yes | yes | good | |
| 17 | −0.6 | 1.0 | yes | yes | yes | excellent | |
| 18 | 0.9 | 1.0 | yes | yes | yes | good | |
| 19 | 0.9 | 1.0 | yes | yes | yes | good | |
| 20 | −0.8 | 1.0 | yes | yes | yes | good | |
| 21 | −0.9 | 0.9 | yes | yes | yes | good | |
| *22 | 2.0 | 0.6 | yes | no | no | poor | |

Samples marked with * lie outside the scope of the invention.

As will be obvious from Table 2, in the case of the sample No. 22 of Comparative Example, the wiring board was warped twice as much as the reference warping, the shearing strength was as small as 0.6 times of the reference shearing strength, the conduction was lost after 2000 cycles, and the thermal fatigue life was very short. In the case of the sample No. 1 lying outside the scope of the present invention, the gap between the wiring pattern and the electrode for connection of the wiring circuit was smaller than 50 µm, and the short-circuit took place. Therefore, the sample No. 1 was not usable as the wiring board.

According to the present invention, on the other hand, the wiring boards all exhibited satisfactory properties in regard to warping, shearing strength and thermal fatigue life, and were practically usable.

From Table 2, furthermore, it will be understood that the warping of the surface of the insulating board on which the semiconductor element is mounted can be controlled by controlling the position and coefficient of contraction upon firing of the conductor layer provided in a region under the portion where the semiconductor element is mounted.

What is claimed is:

1. A wiring board for flip-chip-mounting a semiconductor element having a number of flip-chip-connect electrodes arranged in a circular manner along a peripheral edge on a lower surface thereof, the wiring board comprising:

a ceramic insulating board having a surface region for mounting said element, and a wiring pattern that is to be connected to said flip-chip-connect electrodes, said wiring pattern including conductor lines of a number corresponding to the flip-chip-connect electrodes of the semiconductor element that is flip-chip-mounted, each line constituting the wiring pattern including a horizontal conductor passage that extends in a horizontal direction inside the insulating board and a via-hole conductor passage that extends upward from an end of said horizontal conductor passage to said surface region, ends of the via-hole conductor passages and of the horizontal conductor passages being positioned in a circular manner so as to correspond to the flip-chip-connect electrodes of said semiconductor element to define an open space in which no horizontal conductor passage is formed; and a conductor layer having a plane shape formed in said insulating board on a portion located within said surface region or below said surface region, as viewed from the upper side of said insulating board, and the plane shape of said conductor layer is positioned in space defined by the ends of said via-hole conductor passages and the horizontal conductor passages, and a gap between the conductor layer and the horizontal conductor passages or the via-hole conductor passages being not smaller than 50 µm.

2. A wiring board according to claim 1, wherein said conductor layer has a rectangular planar shape.

3. A wiring board according to claim 1, wherein said conductor layer is formed in a portion which is deep by not more than 750 µm from the surface of the insulating board.

4. A wiring board according to claim 1, wherein said conductor layer is formed on a plane in flush with the horizontal conductor passages of said wiring pattern.

5. A wiring board according to claim 1, wherein said horizontal conductor passages and said conductor layer are formed by simultaneously firing a paste containing an electrically conducting material and a ceramic green sheet forming the insulating board.

6. A wiring board according to claim 5, wherein said conductor layer and said horizontal conductor passages are formed by using pastes containing an electrically conducting material satisfying a firing contraction ratio S1/S2 as represented by the following formula, Firing contraction ratio =S1/S2 wherein S1 is a coefficient of volume contraction of a fired sheet obtained by firing a sheet formed of an electrically conducting material-containing paste for forming a conductor layer having a thickness of 100 μm at a temperature same as the firing temperature for forming the insulating board, and S2 is a coefficient of volume contraction of a fired sheet obtained by firing a sheet formed of an electrically conducting material-containing paste for forming horizontal conductor passages having a thickness of 100 μm at a temperature same as the firing temperature for forming the insulating board,
of from 0.6 to 1.4.

7. A wiring board according to claim 1, wherein the wiring pattern and the conductor layer are formed from a sinterable conductive paste.

8. A wiring board according to claim 7, wherein the ceramic insulating board, the wiring pattern and the conductor layer are simultaneously fired together.

9. A method of manufacturing a wiring board for flip-chip mounting a semiconductor element having a plurality of flip-chip-connect electrodes arranged in a circular manner along a peripheral edge, the method comprising the steps of:

forming an unsintered green sheet for an insulating board having a surface region for mounting said element;

placing an electrically conductive paste that becomes a wiring pattern in the unsintered green sheet, the wiring pattern having conductor lines, each of the conductive lines including a horizontal conductor passage that extends in a horizontal direction inside the insulating board and a via-hole conductor passage that extends upward from an end of said horizontal conductor passage to said surface region, ends of the via-hole conductor passages and of the horizontal conductor passages being positioned in a circular manner so as to correspond to the flip-chip-connect electrodes of said semiconductor element to define an open space in which no horizontal conductor passage is formed;

placing an electrically conductive paste that becomes a central layer in the space in the unsintered green sheet on a portion located within said surface region or below said surface region; and simultaneously firing the unsintered green sheet, the electrically conductive paste that becomes the wiring pattern and the electrically conductive paste that becomes the conductor layer.

10. A method for manufacturing a wiring board according to claim 9, wherein the central layer has an area that is substantially as large as the space, as viewed from above.

11. A method for manufacturing a wiring board according to claim 10, wherein a gap is formed between the conductor layer and the horizontal conductor passages or the via-hole conductor passages, the gap being not smaller than 50 μm when fired.

12. A method for manufacturing a wiring board according to claim 10, wherein the conductor layer is formed in a portion at a depth not more than 750 μm from the surface of the insulating board.

13. A method for manufacturing a wiring board according to claim 10, wherein the conductor layer is formed on a plane flush with the horizontal conductor passages of the wiring pattern.

14. A method for manufacturing a wiring board according to claim 9, wherein the electrically conductive pastes that become the conductor layer and the horizontal conductor passages has a firing contraction ratio S1/S2, where S1 is a coefficient of volume contraction of a fired sheet obtained by firing a sheet formed of an electrically conducting material-containing paste for forming a conductor layer having a thickness of 100 μm at a temperature same as the firing temperature for forming the insulating board, and S2 is a coefficient of volume contraction of a fired sheet obtained by firing a sheet formed of an electrically conducting material-containing paste for forming horizontal conductor passages having a thickness of 100 μm at a temperature same as the firing temperature for forming the insulating board.

15. A method for manufacturing a wiring board according to claim 14, wherein the contraction ratio is in a range between 0.6 and 1.4.

* * * * *

UNITED STATES PATENT AND TRADEMARK OFFICE
CERTIFICATE OF CORRECTION

PATENT NO. : 6,288,347 B1
DATED : September 11, 2001
INVENTOR(S) : Nakagawa et al.

It is certified that error appears in the above-identified patent and that said Letters Patent is hereby corrected as shown below:

<u>Column 1,</u>
Line 75, add "Yasutomi ASAI; Shinji OTA; Takashi NAGASAKA" --.

Signed and Sealed this

Twelfth Day of March, 2002

Attest:

JAMES E. ROGAN
Attesting Officer  Director of the United States Patent and Trademark Office